US011917506B2

(12) United States Patent
Boyd et al.

(10) Patent No.: US 11,917,506 B2
(45) Date of Patent: *Feb. 27, 2024

(54) METHODS FOR PRODUCING SECURITY AND TRACKING SYSTEMS INCLUDING ENERGY HARVESTING COMPONENTS FOR PROVIDING AUTONOMOUS ELECTRICAL POWER

(71) Applicant: FACE INTERNATIONAL CORPORATION, Norfolk, VA (US)

(72) Inventors: Clark D Boyd, Portsmouth, VA (US); Bradbury R Face, Smithfield, VA (US); Jeffrey D Shepard, Norco, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/723,435

(22) Filed: Apr. 18, 2022

(65) Prior Publication Data
US 2022/0248193 A1    Aug. 4, 2022

Related U.S. Application Data

(63) Continuation of application No. 15/416,534, filed on Jan. 26, 2017, now Pat. No. 11,310,637.

(51) Int. Cl.
*H04W 4/38* (2018.01)
*G02B 5/26* (2006.01)
(Continued)

(52) U.S. Cl.
CPC ............ *H04W 4/38* (2018.02); *G02B 5/0242* (2013.01); *G02B 5/0284* (2013.01);
(Continued)

(58) Field of Classification Search
CPC .. G02B 5/0242; G02B 5/0284; G02B 5/0289; G02B 5/0294; G02B 5/206; G02B 5/26;
(Continued)

(56) References Cited

U.S. PATENT DOCUMENTS 4,967,956 A    11/1990    Mansfield et al.
5,877,874 A    3/1999    Rosenberg
(Continued)

FOREIGN PATENT DOCUMENTS

KR    20110031645 A    3/2011
WO    2014178180 A1    11/2014

OTHER PUBLICATIONS

International Search Report for PCT/US2016/027393 dated Jul. 29, 2016.
Written Opinion for PCT/US2016/027393 dated Jul. 29, 2016.

*Primary Examiner* — Minh N Trinh
(74) *Attorney, Agent, or Firm* — Lowndes; Stephen C. Thomas

(57) ABSTRACT

A method is provided that integrated a unique set of structural features for concealing self-powered sensor and communication devices in aesthetically neutral, or camouflaged, packages that include energy harvesting systems that provide autonomous electrical power to sensors, data processing and wireless communication components in the portable, self-contained packages. Color-matched, image-matched and/or texture-matched optical layers are formed over energy harvesting components, including photovoltaic energy collecting components. Optical layers are tuned to scatter selectable wavelengths of electromagnetic energy back in an incident direction while allowing remaining wavelengths of electromagnetic energy to pass through the layers to the energy collecting components below. The layers uniquely implement optical light scattering techniques to make the layers appear opaque when observed from a light incident side, while allowing at least 50% and as much as 80+%, of the energy impinging on the energy or incident side to pass through the layer.

18 Claims, 7 Drawing Sheets

(51) Int. Cl.
*G02B 5/02* (2006.01)
*G02B 5/20* (2006.01)
*G08C 17/02* (2006.01)
*H04Q 9/00* (2006.01)
*H01L 31/048* (2014.01)
*H02J 7/35* (2006.01)

(52) U.S. Cl.
CPC ......... *G02B 5/0289* (2013.01); *G02B 5/0294* (2013.01); *G02B 5/206* (2013.01); *G02B 5/26* (2013.01); *G08C 17/02* (2013.01); *H01L 31/048* (2013.01); *H02J 7/35* (2013.01); *H04Q 9/00* (2013.01); *G08C 2201/11* (2013.01); *H04Q 2209/40* (2013.01); *H04Q 2209/886* (2013.01); *Y02E 10/52* (2013.01)

(58) Field of Classification Search
CPC ....... G08C 17/02; G08C 2201/11; H02J 7/35; H04Q 2209/40; H04Q 2209/886; H04Q 9/00
See application file for complete search history.

(56) References Cited

U.S. PATENT DOCUMENTS

| | | | |
|---|---|---|---|
| 8,669,325 | B1 | 3/2014 | Hyman |
| 9,923,514 | B1* | 3/2018 | Boyd .................. H02S 40/22 |
| 11,310,637 | B2* | 4/2022 | Boyd .................. G02B 5/26 |
| 2005/0019712 | A1 | 1/2005 | Ikeda et al. |
| 2009/0269579 | A1 | 10/2009 | Minaki |
| 2010/0278561 | A1 | 11/2010 | Kanda et al. |
| 2011/0278434 | A1 | 11/2011 | Chau et al. |
| 2014/0185282 | A1 | 7/2014 | Hsu et al. |
| 2022/0248193 | A1* | 8/2022 | Boyd .................. G02B 5/206 |

* cited by examiner

300

METHODS FOR PRODUCING SECURITY AND TRACKING SYSTEMS INCLUDING ENERGY HARVESTING COMPONENTS FOR PROVIDING AUTONOMOUS ELECTRICAL POWER

CROSS REFERENCE TO RELATED APPLICATIONS

This application is a continuation of U.S. patent application Ser. No. 15/416,534, entitled METHODS FOR PRODUCING SECURITY AND TRACKING SYSTEMS INCLUDING ENERGY HARVESTING COMPONENTS FOR PROVIDING AUTONOMOUS ELECTRICAL POWER, filed in the United States Patent and Trademark Office (USPTO) on Jan. 26, 2017, which published from the USPTO as U.S. Patent Application Publication No. US 2018-0212560 A1 on Jul. 26, 2018 and which issued as U.S. Pat. No. 11,310,637 on Apr. 19, 2022, the disclosure of which is incorporated by reference herein in its entirety. This application is related to U.S. patent application Ser. No. 15/416,491, entitled "Security And Tracking Systems Including Energy Harvesting Components For Providing Autonomous Electrical Power," which was filed in the USPTO on Jan. 26, 2017, which issued as U.S. Pat. No. 9,923,514 on Mar. 20, 2018, the disclosure of which is incorporated by reference herein in its entirety.

BACKGROUND

1. Field of the Disclosed Embodiments

This disclosure is directed to a method for forming a unique set of structural features for concealing self-powered sensor and communication devices in aesthetically neutral, or camouflaged, packages that include energy harvesting systems that provide autonomous electrical power to sensors, and data processing and wireless communication components in the portable, self-contained packages. Color-matched, image-matched and/or texture-matched optical layers, which provide an essentially same appearance from any viewing angle, and provide superior light transmission across the range of light impingement angles, are formed over energy harvesting components, including photovoltaic components, and sensor components, in the packages, the energy harvesting components self-powering the packages.

2. Related Art

U.S. patent application Ser. No. 15/006,143 (the 143 application), entitled "Systems and Methods for Producing Laminates, Layers and Coatings Including Elements for Scattering and Passing Selective Wavelengths of Electromagnetic Energy", which was filed in the USPTO on Jan. 26, 2016 and which was published from the USPTO as U.S. Patent Application Publication No. US 2016-0306078 A1 on Oct. 20, 2016; and U.S. patent application Ser. No. 15/006, 145 (the 145 application), entitled "Systems and Methods for Producing Objects Incorporating Selective Electromagnetic Energy Scattering Layers, Laminates and Coatings", which was filed in the USPTO on Jan. 26, 2016 and which issued from the USPTO as U.S. Pat. No. 10,795,062 on Oct. 6, 2020, the disclosures of each of which are hereby incorporated by reference herein in their entirety, describe structures for forming selectably energy transmissive layers and certain real world use cases in which those layers may be particularly advantageously employed.

The 143 and 145 applications note that, in recent years, the fields of energy harvesting and ambient energy collection have gained significantly increased interest. Photovoltaic (PV) cell layers and other photocell layers, including thin film PV-type (TFPV) material layers, are advantageously employed on outer surfaces of particular structures to convert ambient light to electricity.

Significant drawbacks to wider proliferation of photocells used in a number of potentially beneficial operating or employment scenarios are that the installations, in many instances, unacceptably adversely affect the aesthetics of the structures, objects or host substrate surfaces on which the PV layers are mounted for use. PV layers typically must be generally visible, and the visual appearance of the PV layers themselves cannot be significantly altered from the comparatively dark greyscale to black presentations provided by the facial surfaces without rendering the layers significantly less efficient, substantially degrading their operation. Presence of photocells and PV layers in most installations is, therefore, easily visually distinguishable, often in an unacceptably distracting, or appearance degrading, manner. Based on these drawbacks and/or limitations, inclusion of photocell arrays, and even sophisticated TFPV material layers, is often avoided in many installations, or in association with many structures, objects or products that may otherwise benefit from the electrical energy harvesting capacity provided by these layers. PV layer installations are often shunned as unacceptable visual detractors or distractors adversely affecting the appearance or ornamental design of the structures, objects or products.

The last several decades have seen an expansive proliferation in all manner of self- powered (read "battery-powered") devices. Developmental efforts are particularly evident in the introduction and use of remote battery-powered sensors and sensor arrays in commercial, industrial, military and security settings for such functions as personnel and/or asset tracking, intrusion detection and all manner of surveillance tasking.

In many commercial, asset tracking, security and operation employment scenarios, the use of batteries has its limitations. "Right sizing" the batteries for a particular surveillance and tracking package result in operationally trading off certain surveillance, sensor, tracking and/or communication capabilities for field-deployable packages in an effort to limit the power drain on the batteries sized for a particular use.

Another drawback, particularly in covert surveillance scenarios, is that even the best batteries will, at some point, need to be changed. There are operating circumstances in which changing batteries is either unacceptable, or impossible. Surveillance and tracking sensors go blind when the batteries deplete, and the packages in which the sensors are housed are, thereby, rendered useless.

Battery technologies continue to improve and efficiencies in sensors and communication components mitigates the power drain in the batteries. Nevertheless, there remain finite limits to battery capacity. Also, the typical chemical residue as a battery depletes may be detectable with appropriate detection resources. Combining these disadvantages with the drawbacks in applying conventional environmental energy harvesting for re-charging the batteries given the identified shortfalls in the use of conventional photovoltaic elements for the reasons enumerated above, leads to a conclusion that, while all of the component elements appear to exist, there is no currently- available solution to economically address the combination of apparent shortfalls across a broad spectrum of employment scenarios.

There are ongoing efforts to reduce power needs of sensors, processors and other electronics components that attempt to address power consumption issues. Generally, however, these efforts remain "battery-centric," with an objective of reducing battery depletion rates, but not with eliminating batteries altogether. Efforts at battery elimination, even as new low-energy communications protocols/standards are being developed specifically for "batteryless" wireless nodes, are stalled based on a lack of an ability to hide batteryless wireless nodes. The efforts are hamstrung with the inability to be divorced from conventional photovoltaic elements. Put another way, there is no aesthetically neutral, or aesthetically pleasing manner by which to present the nodes, particularly in residential, and retail, office, and other commercial environments.

In this regard, the formidable challenges associated with the massive logistics effort involved in changing/maintaining batteries in large wireless sensor/security/safety networks remain. These challenges adversely impact all manner of technologic innovation. For example, consider that industry estimates suggest that, based on the number of powered nodes that are anticipated to populate the Internet of Things (IoT), as envisioned, in the comparatively near future, and even if a battery lasts for ten years, something well in excess of 250 million batteries per day will need to be changed in order to keep the network running. Those estimates are conservative and they drive not only the efforts to reduce the overall load on batteries as a whole but also efforts to find battery replacements. The lack of an effective power sourcing scheme to support the broad expansion that the IoT may enjoy is cited as a major factor slowing the adoption and proliferation of the IoT.

SUMMARY

The 143 and 145 applications introduce systems and methods that provide particularly formulated energy or light transmissive overlayers, which may be provided to "hide" typical photoelectric energy generating devices, and sensor components. These overlayers, generally in the form of surface treatments and/or coverings, are formulated to support unique energy transmission and light refraction schemes to effectively "trick" the human eye into seeing a generally opaque surface when observed from a light incident side. These overlayers are formulated to support transmission of visual light, or near-visual light, in a manner that allows a substantial percentage (at least 50% and up to 80+%) of the electromagnetic energy impinging on the surface of the overlayer to penetrate the surface treatments and coverings in a comparatively unfiltered manner. The overlayers also provide an opaque appearing surface that exhibits an essentially same appearance when viewed from any viewing angle, and that support a consistently superior light transmission across a full range of light impingement angles. The energy transmissive layers disclosed in the 143 and 145 applications rely on a particular cooperation between refractive indices of the disclosed micron-sized particles or spheres with cooperating refractive indices of the matrix materials in which those micron-sized particles are suspended for deposition on prepared surfaces. This coincident requirement between the refractive indices of the matrix material on the refractive indices of the suspended particles limits deposition of these material suspensions of particles on substrates to techniques in which the deposition of the materials can be carefully controlled.

U.S. patent application Ser. No. 15/415,851, entitled "Compositions Of Materials For Forming Coatings And Layered Structures Including Elements For Scattering And Passing Selectively Tunable Wavelengths Of Electromagnetic Energy," and Ser. No. 15/415,857, entitled "Methods For Making Compositions Of Materials For Forming Coatings And Layered Structures Including Elements For Scattering And Passing Selectively Tunable Wavelengths Of Electromagnetic Energy," and Ser. No. 15/415,864, entitled "Delivery Systems and Methods For Compositions Of Materials For Forming Coatings And Layered Structures Including Elements For Scattering And Passing Selectively Tunable Wavelengths Of Electromagnetic Energy," each of which was filed Jan. 25, 2017, and the disclosures of which are hereby incorporated by reference herein in their entirety, improve upon the inventive concepts disclosed in the 143 and 145 applications by controlling the refractive indices of the particles themselves to capture all of the physical parameters leading to independent color selection in the particles, thereby easing reliance on a cooperative synergy between a composition of the particles and a composition of the binder or matrix material in which the particles are suspended.

It would be advantageous to apply the selectively colorable and/or texturizable overlayers disclosed in detail in the above applications to energy harvesting elements, sensors, communication components and associated circuitry to field self-powered sensor and communication packages that (1) provide detection capabilities to detect any sensor measurable parameters according to the capabilities of installed sensors; (2) camouflage or otherwise commercially package the sensors, communication and energy harvesting elements as a particular commercial or other operating scenario dictates; (3) provide communication connectivity by establishing wireless communication with compatible receiving nodes and/or by establishing an ad hoc mesh network between cooperating packages; and/or (4) eliminate a requirement to change batteries thereby avoiding disadvantages associated with battery depletion including loss of sensor and/or communication capability, or exposure of, for example, covert package deployment necessitated by battery replacement.

Exemplary embodiments may provide substantially transparent particles, including micron-sized particles, in a cooperating binder matrix to produce material compositions for layers in which refractive indices of the constituent elements of the layers are cooperatively controlled to produce repeatable coloration in the layers causing them to appear opaque from a light-incident side, and yet retaining a capacity to transmit at least 50%, and as much as 80+%, of the incident electromagnetic energy therethrough to impinge, for example, on photoelectric or photovoltaic energy harvesters positioned behind the layers.

Exemplary embodiments may form energy transmissive layers over photovoltaic arrays, the energy transmissive layers providing an opaque appearing surface that exhibits an essentially same appearance when viewed from any viewing angle, and supporting a consistently superior light transmission across a full range of light impingement angles.

Exemplary embodiments may provide a TFPV material layer on a substrate. In embodiments, sensor and communication elements may also be provided on the substrate. The disclosed TFPV material layers, and the other elemental components, may be adhesively conformed to the substrate and then hidden by being overcoated with the disclosed energy transmissive overlayer material. The other elemental components may include, but not be limited to, signal conditioning and other electronics components between the sensors themselves and the communications elements.

Exemplary embodiments may provide electrical circuits that convert the energy collected by the TFPV layer into usable electrical power for use by the sensors, communication components and other electrically-powered elements in self-powered packages.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed methods that provide schemes for forming a unique set of structural features for concealing self-powered sensor and communication devices in aesthetically neutral, or camouflaged, packages that include energy harvesting systems that provide autonomous electrical power to sensors, data processing and wireless communication components in the portable, self-contained packages, will be described, in detail, with reference to the following drawings, in which.

DETAILED DESCRIPTION OF EMBODIMENTS

Figure 1:
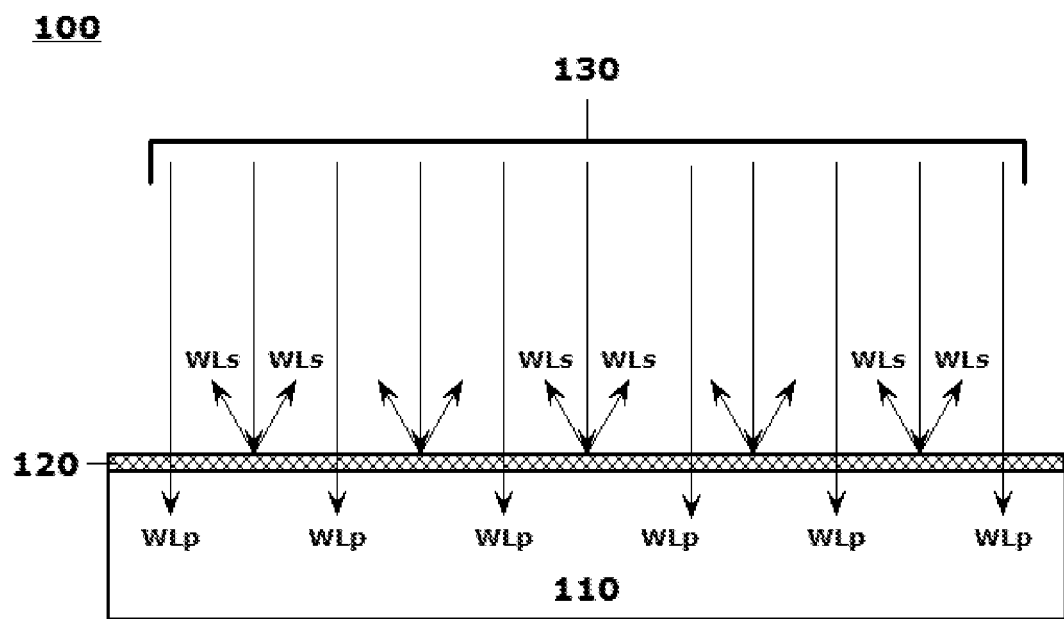
FIG. 1 illustrates a schematic diagram of an exemplary object energy/light scattering surface layer disposed on a structural body member substrate according to this disclosure.

The disclosed methods for forming unique set of structural features for concealing self-powered sensor and communication devices in aesthetically neutral, or camouflaged, packages that include energy harvesting systems that provide autonomous electrical power to sensors, data processing and wireless communication components in portable, self-contained packages, will be described as being particularly usable for personnel and/or asset (package) tracking, intrusion detection and all manner of surveillance tasking, including wide area and covert surveillance, and for carrying into effect certain monitoring functions. These real-world applications for the disclosed energy harvesting, sensor and communication systems should not be considered as limiting those systems. Rather, the disclosed embodiments are intended to provide an overview of a particular system architecture that may be implemented to autonomously provide electrical power to integral sensor and/or communications capabilities in support of any one of a number of devices that may be used for (1) surveillance tasks (including wide-area surveillance and intrusion detection among others) and (2) individual personnel or asset tracking (including tagging cargo, commercial packages, personal luggage and individuals with active identifiers and geo-locating capabilities).

It should be appreciated that surveillance, tracking and monitoring functions that may be facilitated with self-powered sensor and communication devices as described herein are not limited to those that may be considered to fall in the traditional category of "security" monitoring. Rather, employment of the disclosed self-powered sensor and communication devices may be equally effective in surveillance, tracking and monitoring functions that may be associated with traditional "safety" concerns.

Consider, for example, a function of employing sensors to monitor temperatures of wheel bearings on rail cars (overheated wheel bearings having been cited as a comparatively high percentage cause of train derailings). There are currently proposed regulations directed at countering this risk by providing that wheel bearings on rail cars must be monitored in real-time. Delays in implementation of such important safety regulations are understood to center around the cost-prohibitive nature of implementing an effective monitoring scheme. Adapting the disclosed self-powered sensor and communication devices with appropriate thermal sensors, in an undetectable deployable self-contained package, may effectively address this known gap in safe and efficient operations of railcars. Operational data, as will be described in greater detail below, may be sensed, stored and/or transmitted to carry into effect the real-time monitoring function in this real-world scenario.

Interestingly, an area in which security and safety concerns overlap is in the monitoring of all manner of packages from hand-carried packages to containerized shipping for the presence of hazardous materials. Appropriately-sized self-powered sensor and communication devices according to this disclosure may address this real-world employment scenario as well.

Reference will be made to substantially transparent multi-layer micron-sized particles, and the material compositions in which those particles may be delivered, and the systems and methods for delivery of those material compositions onto substrate surfaces that have been previously provided with conformal photovoltaic arrays, particularly in a form of a TFPV material layer, according to this disclosure. The disclosed schemes may include techniques for depositing and curing material compositions that suspend substantially transparent multi-layer micron-sized particles in substantially transparent binder or matrix materials, techniques for developing material compositions into structural layers, and delivery systems and techniques for developing the multi-layered structure, which may be a laminated structure, in which color-selectable electromagnetic energy transmissive layers are formed over the photovoltaic components, as well as the sensor and communication elements. These layers, once formed, may selectively scatter specific wavelengths of electromagnetic energy impinging on an energy incident side of the layers, while allowing remaining wavelengths of the electromagnetic energy to pass therethrough. These layers may uniquely implement optical light scattering techniques in such energy transmissive layers to provide an aesthetically neutral, or a surface presentation selectable, outer surface that is substantially comparable in appearance to any painted surface. These layers may also provide an opaque appearing surface that exhibits an essentially same appearance when viewed from any viewing angle, and that supports a consistently superior light transmission across a full range of light impingement angles. Because the disclosed "coatings" do not include pigment materials, the overlayers comprised of these substantially transparent materials are not susceptible to fading over time. In order to provide a usable electrical energy, the disclosed ovelayers may be particularly formed to selectively scatter particular wavelengths of electromagnetic energy, including light energy in the visual, near-visual or non-visual range, while allowing remaining wavelengths to pass therethrough with a transmissive efficiency of at least 50%, and as much as 80+%, with respect to the impinging energy.

Additional details regarding the above-discussed energy transmissive layers are available in the various related applications catalogued above, the disclosures of which are incorporated by reference herein in their entireties.

Exemplary embodiments described and depicted in this disclosure should not be interpreted as being specifically limited to any particularly limiting material composition of the individually-described substantially transparent multi-layer micron-sized particles, and the binder matrices in which those particles may be suspended, except as indicated according to the material properties generally outlined below. Further, the exemplary embodiments described and depicted in this disclosure should not be interpreted as specifically limiting the configuration of any of the described layers, or of the substrates on which the disclosed energy harvesting structures may be formed.

References will be made to individual ones, or classes, of energy/light collecting sensor components and energy/light activated devices that may be operationally mounted in, installed in or placed behind the disclosed energy/light scattering, light directing or light transmissive layers so as to be hidden from view when an object including such sensor component or device is viewed from a viewing, observation or light incident outer surface of the object or layer, from which perspective the energy/light scattering, light directing or light transmissive layers may appear "opaque" to the incident electromagnetic energy. These references are intended to be illustrative only and are not intended to limit the disclosed concepts, compositions, processes, techniques, methods, systems and devices in any manner. It should be recognized that any advantageous use of the disclosed structures and schemes for providing an autonomous energy harvesting capability in self-powered packages employing systems, methods, techniques, and processes such as those discussed in detail in this disclosure is contemplated as being included within the scope of the disclosed exemplary embodiments.

In this regard, the disclosed systems and methods will be described as being particularly adaptable to hiding certain photovoltaic materials, and the emerging class of increasingly efficient TFPV materials or material layers, which are typically mils thick, on the surfaces of, or within objects, behind layers that may appear opaque from a viewing, observation or light incident side. As used throughout the balance of this disclosure, references to TFPV material layers are not intended to exclude other types of photovoltaic materials, and/or any generally known configuration as to any photocells.

FIG. 1 illustrates a schematic diagram 100 of an exemplary object energy/light scattering surface layer 120 disposed on a transparent portion of a body structure 110. As shown in FIG. 1, the energy/light scattering layer 120 is configured to allow first determined wavelengths of energy/light, WLp, to pass through the energy/light scattering layer 120. The configuration of the energy/light scattering layer 120 simultaneously causes certain second determined wavelengths of energy/light, WLs, to be scattered back in an incident direction substantially as shown.

The energy/light scattering layer 120 may be configured of substantially transparent micron-sized particles of varying sizes. In embodiment, these particles may be substantially in a range of 5 microns or less. The substantially transparent micron-sized particles may be stabilized in structural or other layers further comprised of substantially-transparent matrix materials including, but not limited to, dielectric materials. An ability to configure the substantially transparent micron-sized particles to "tune" the light scattering surface of the light scattering layer 120 to scatter particular second determined wavelengths of energy/light, WLs, may provide the capacity of the energy/light scattering layer 120 to produce a desired visual appearance in a single color, multiple colors, or according to an image-wise visual presentation provided by the energy/light scattering layer 120. Put another way, depending on a particular composition of the substantially transparent micron-sized particles comprising the energy/light scattering layer 120 (or multiple layers), one or more colors, textures, color patterns, or color-patterned images may be visually produced by the energy/light scattering layer 120.

In cases where the incident energy includes wavelengths in the visual spectrum, refractive indices of the energy/light scattering layer 120 may be selectively tuned based on structural compositions of the substantially transparent micron-sized particles, and the substantially-transparent binder or matrix materials in which the particles are suspended. In embodiments, the energy/light scattering layer 120 is intended to appear as a single color across a surface of the energy/light scattering layer 120. To this end, the composition of the particles and matrix scheme across the surface of the energy/light scattering layer 120 may be substantially identical, or homogenous.

A light scattering effect of the energy/light scattering layer 120 may be produced in response to illumination generally from ambient light in a vicinity of, and/or impinging on, the surface of the energy/light scattering layer 120. Alternatively, the light scattering effect of the energy/light scattering layer 120 may be produced in response to direct illumination generally produced by some directed light source 130 focusing illumination on the light-incident surface of the energy/light scattering layer 110.

Figure 2:
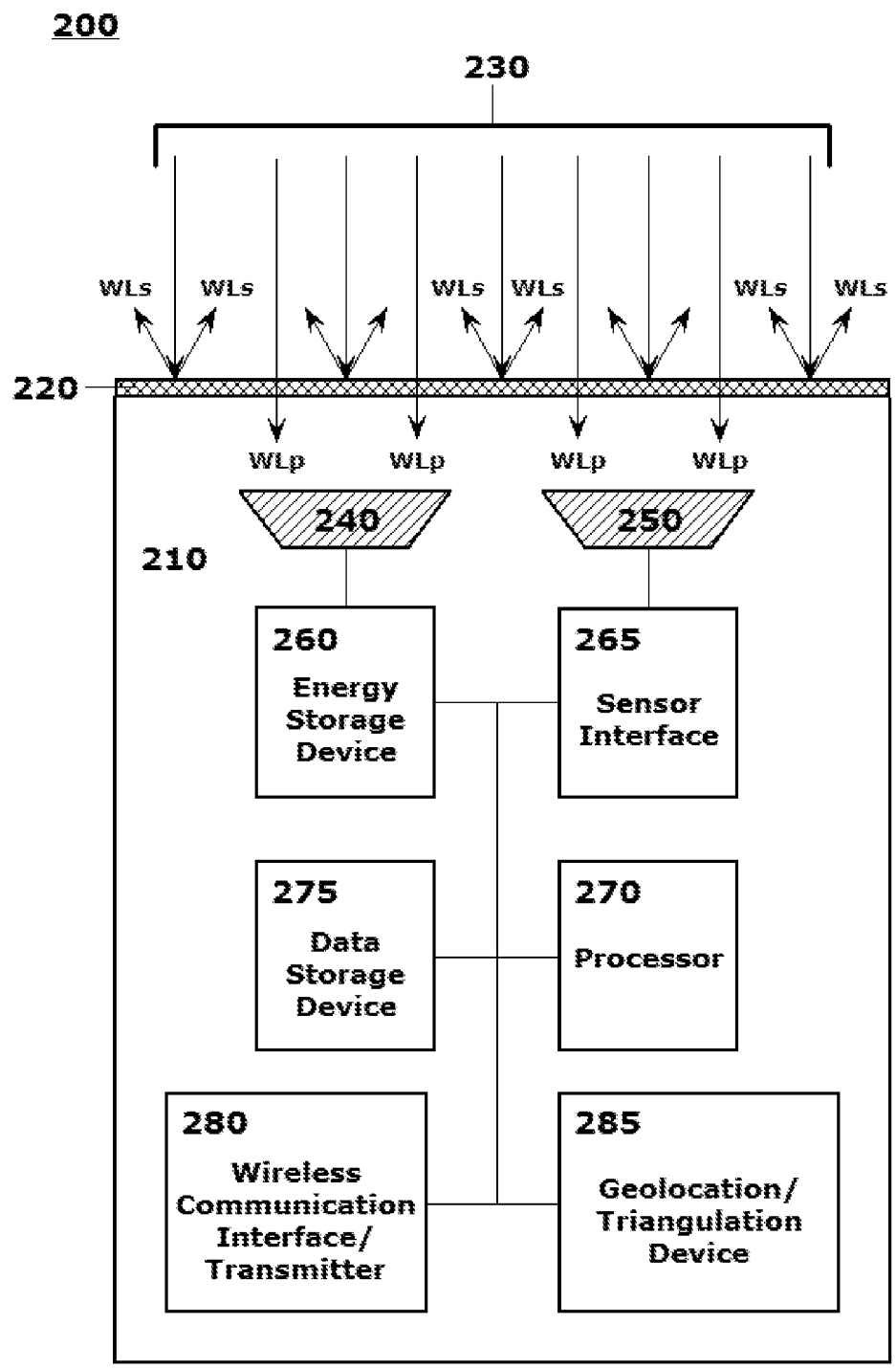
FIG. 2 illustrates a schematic diagram of an exemplary self-powered sensor and communication device for local or remote deployment in surveillance and monitoring scenarios including an energy harvester, light sensitive (or other physical parameter measuring) sensor elements and communication capabilities mounted in a structural body member having a surface constituted of an energy/light scattering surface layer according to this disclosure.

FIG. 2 illustrates a schematic diagram of an exemplary self-powered sensor device 200 for remote deployment in surveillance, tracking and monitoring scenarios. The self-powered sensor device 200 may include an energy harvesting element 240, a sensor element 250 and communication capabilities mounted in or on a structural body member 210. The energy harvesting element 240 may provide electrical power to the sensor element 250. The sensor element 250 may be configured to measure at least one physical parameter and to output a signal based on the measured physical parameter. The physical parameters measured by the sensor element may include, but not be limited to, light, heat and motion. The self-powered sensor device 200 may include a processor 270 that may control operations of the various elements in the self-powered sensor device and/or convert output signals from the sensor element 250 to data communications for transmission by the wireless communicating device 280. The self-powered sensor device 200 may also include a data storage device 275 for storing data from the sensor element 250, data transmissions generated by the processor 270, and/or operating instructions for the various elements in the self-powered sensor device 200.

The self-powered sensor device 200 may have a surface constituted of an energy/light scattering surface layer 220 according to this disclosure. As shown in FIG. 2, at least first determined wavelengths, WLp, of the ambient light in a vicinity of the light scattering layer 220, or of light directed from a light source 230 at the light scattering layer 220, may pass through the light scattering layer 220, in the manner described above with reference to the embodiment shown in FIG. 1, while at least second determined wavelengths, WLs, of the ambient light, or the directed light, may be scattered back in the incident direction in the manner described above. The at least first wavelengths, WLp, of the ambient light, or the directed light, may be caused to impinge on a facing or facial surface of the energy harvesting element 240, which may be in a form of a photocell or a TFPV material covered component. The at least first wavelengths of energy/light, WLp, impinging on an energy harvesting element 240 may cause the energy harvesting element 240 to generate electrical energy which may be stored in a compatible energy storage device 260 allowing the combination of the energy harvesting element 240 and the compatible energy storage device 260 to power other components in the self-powered sensor device 200.

The at least first wavelengths, WLp, of the ambient light, or the directed light, may be caused to impinge on a facing or facial surface (or a lens) of sensor element 250. At least the first wavelengths, WLp, of the ambient light, or the directed light, may cause the sensor element 250 to generate a particular output signal, which may be output directly, or via some manner of sensor interface 265, to the processor 270 for signal processing, as indicated above. In embodiments, a configuration of the sensor element 250 may enable emission of electromagnetic energy in a form broadly of a sensor signal outward from a sensor side of the light scattering layer 220 through the light scattering layer 220 to, for example, be reflected off a target for measurement of a parameter of the target.

The first wavelengths of energy/light, WLp, impinging on the sensor element 250 may be conditioned through one or more energy/light focusing/filtering layers that may be in a form of optical isolators, prisms, lenses or the like, and that may focus, filter or otherwise condition the first wavelengths of energy/light, WLp, as may be appropriate to modify an input of the energy to the sensor element 250 to be compatible with the capabilities, or input requirements, of the sensor element 250, particularly when provided in the form of a camera and/or other imaging device. Those of skill in the art will recognize that the first wavelengths of energy/light, WLp, may require minor modification and/or re-filtering to be rendered compatible.

In embodiments, the first wavelengths of energy/light, WLp, may also or otherwise be partially blocked from further transmission to and through the structural body member 210 by one or more opaque, near opaque, or darkened energy/light shades, which may be in a form of solid object body components. The energy/light shades may substantially shield or shadow portions of the structural body member 210, and any area or sensor placed behind the energy/light scattering layer 220 in the structural body member 210 from exposure to the first wavelengths of energy/light, WLp. Energy/light filtering layers (or elements) and energy/light shades may be arranged in any configuration to function exclusively, or otherwise to function cooperatively, to control and/or otherwise direct the transmission of the first wavelengths of energy/light, WLp, through the structural body member 210 to one or both of the energy harvesting element 240 and the sensor element 250.

As noted briefly above, the data storage device 275 may be provided to store operating programs to be referenced by the processor 270 in carrying out functional control of the self-powered sensor device 200. Separately, the data storage device 275 may be provided to at least temporarily store information obtained via the sensor element 250, and as may be modified by the sensor interface 265.

A wireless communication capability may be provided with the inclusion of the wireless communicating device 280, which may be in a form of a low-power radio or satellite communication transmitter operating according to any one or more of a number of wireless communicating protocols, including such protocols as may be usable to cause the self-powered sensor device to communicate with other similarly-situated self-powered sensor devices to form an ad hoc wireless communication mesh network between such similarly-situated devices. See FIG. 5. As indicated, the wireless communicating devices 280 may operate according to any compatible wireless signal processing protocol including, but not limited to, Wi-Fi, WiGig, Bluetooth®, Bluetooth® Low Energy (LE) (also referred to as Bluetooth® Smart or Version 4.0+ of the Bluetooth® specification), ZigBee®, or other similar wireless signal processing protocol for communication of wireless signals to appropriate local or remote compatible receivers.

The self-powered sensor device 200 may include a geolocation/triangulation device 285. The geolocation/triangulation device 285 may be a function of the processor 270 in communication with the wireless communicating device 280, or may constitute a stand-alone element in the exemplary self-powered sensor device 200. The geolocation/triangulation device 285 may provide a capacity for the self-powered sensor device 200 to determine its own location, or its location with regard to other self-powered sensor devices with which it may be in communication. In embodiments, the geolocation/triangulation device 285 may constitute, for example, a global positioning satellite (GPS) receiver. In other embodiments, the geolocation/triangulation device 285 may operate in concert with the wireless communicating device 280 to triangulate a position of the self-powered sensor device 200 with respect to known positions of data gateway access nodes and, for example, an assessment of received signal strengths (RSS) from those nodes. Virtually any capability by which a radio receiver may be able to assess an own position of the radio receiver may be implemented in the self-powered sensor device 200.

FIGS. 3A-3D illustrate a series of schematic diagrams of steps in an exemplary process 300 for forming a laminated energy harvesting, sensor and communication component, with at least one layer constituted as a light scattering constituent layer, according to this disclosure.

Figure 3A:
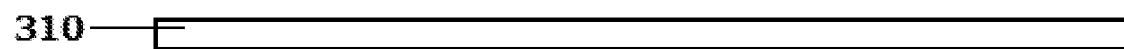
FIGS. 3A-3D illustrate a series of schematic diagrams of steps in an exemplary process for forming a laminated energy harvesting, sensor and communication component, with at least one layer constituted as an energy/light scattering layer, according to this disclosure.

As shown in FIG. 3A, a substrate component 310 may be provided.

Figure 3B:
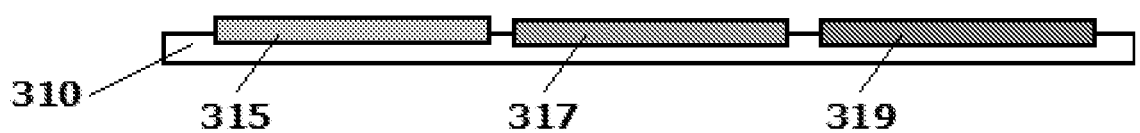

As shown in FIG. 3B, a photovoltaic layer (or component) 315 may be disposed on the substrate component 310. The photovoltaic layer 315 may comprise one or more of a photocell, an array of photocells, or a TFPV material layer. Separately, one or more of a sensor device 317 and a communicating device 319 may also be disposed on the substrate component 310. Further, the photovoltaic layer 315, the sensor device 317 and a communicating device 319 may be positioned on a contiguous surface of the substrate component 310, or may be partially embedded in a cavity in the surface of the substrate component 310, or may be completely embedded in a cavity in the surface of the substrate component 310 in a manner that an upper surface of the photovoltaic layer 315, the sensor device 317 and the communicating device 319 substantially corresponds to an upper surface of the substrate component 310. In embodiments, a TFPV material layer may be adhesively attached to, or formed on, the substrate component 310. In embodiments, a surface treatment may be applied to portions of the surface of the substrate component 310 that are not covered by the photovoltaic layer 315. The surface treatment, when applied, is intended to render an optical reflectance of the portions on which the surface treatment is applied to be substantially equal to an optical reflectance of the TFPV material layer in order to provide a consistent undersurface for application of an energy/light scattering layer.

Figure 3C:
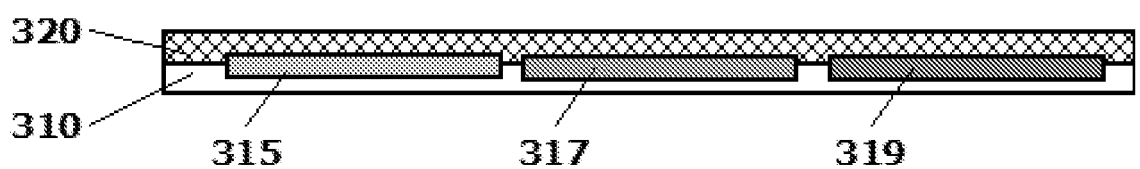

As shown in FIG. 3C, an energy/light scattering layer 320 may be formed on/over the photovoltaic layer 315, the sensor device 317 and the communicating device 319 in a manner that first determined wavelengths of the ambient light in the vicinity of the energy/light scattering layer 320 may pass through the energy/light scattering layer 320, in the manner described above with reference to the embodiments shown in FIGS. 1 and 2, to activate either or both of the photovoltaic layer 315, and the sensor device 317, while at least second determined wavelengths of the ambient light may be scattered back off the energy/light scattering layer 320 in the incident direction in the manner described above.

Figure 3D:
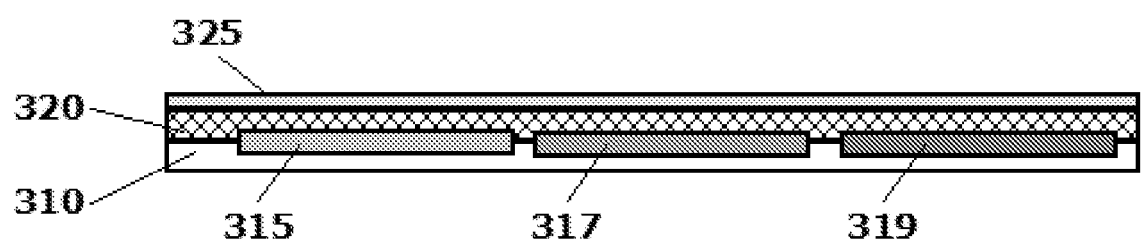

As shown in FIG. 3D, the laminated structure of the energy harvesting component may be finished by covering, or even encapsulating, the laminated structure in a substantially clear, protective overcoat or outer layer 325. This protective overcoat or outer layer 325 may be in a form, for example, of a clear coat finish.

Figure 4:
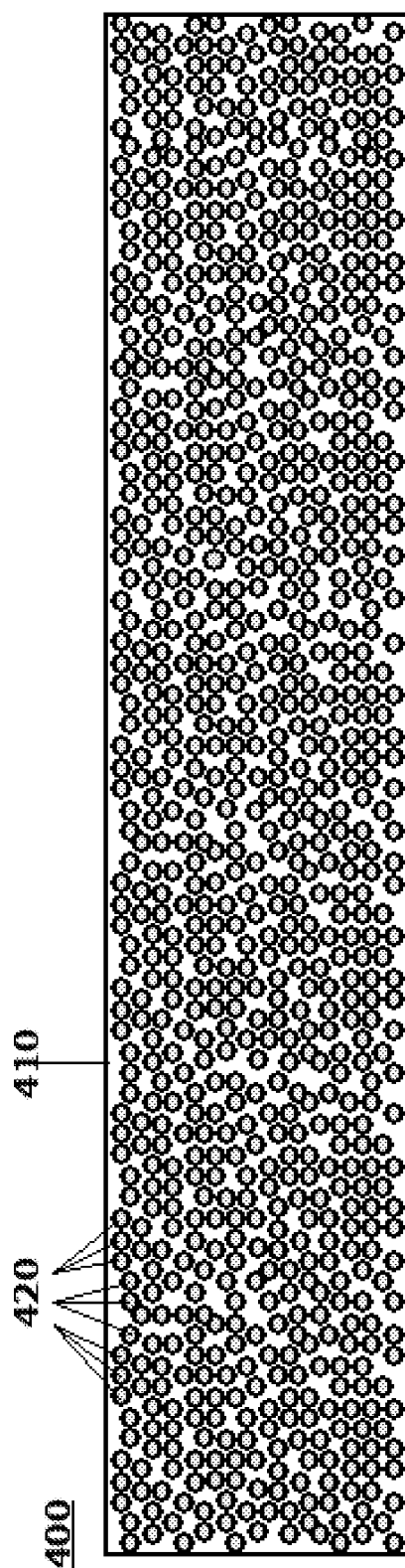
FIG. 4 illustrates an exemplary embodiment of a detail of an energy/light scattering layer usable in the energy harvesting systems according to this disclosure.

FIG. 4 illustrates an exemplary embodiment of a detail of an energy/light scattering layer 400 according to this disclosure. The disclosed schemes, processes, techniques or methods may produce an energy/light scattering layer 400 created using substantially transparent multi-layer micron-sized particles 420. Those particles may be in range of diameters of 5 microns or less embedded in a substantially-transparent dielectric matrix 410. As an example, the substantially transparent multi-layer micron-sized particles 420 may include titanium dioxide nanoparticles in a layered form. Titanium dioxide is widely used based on its brightness and comparatively high refractive index, strong ultraviolet (UV) light absorbing capabilities, and general resistance to discoloration under exposure to UV light.

In embodiments of the energy/light scattering layers, colorations of the layered materials may be achieved through combinations of (1) material compositions of the particles, (2) material compositions of the binders, (3) nominal particle sizes, (4) nominal particle spacings, and (5) interplay between any or all of those material factors. That "interplay" is important. In other embodiments, the material interplay may be captured in varying layers of a substantially transparent multi-layer micron-sized particle, thus requiring the only variables to be controlled as particle size and particle physical composition. Capturing all of the physical parameters in the substantially transparent multi-layer micron-sized particle substantially eliminates any requirement for constituent interplay between the particles and the binder, essentially rendering the particles binder or matrix material agnostic. In embodiments including the multi-layer particles, the binder or matrix material is provided simply to hold the particles where they land. Spacing between the particles is rendered based on a substantially clear, neutral outer coating on the substantially transparent multi-layer micron-sized particles, typically of a substantially transparent dielectric material having a comparatively low (less than 2) index of refraction. The employment of multi-layer particles provides increased latitude in the use of randomized delivery methods, including spray delivery of an aspirated composition of non-pigment particulate material suspended in a comparatively transparent or relatively clear binder material.

In embodiments with particles comprised of layered constructions, a core sphere may have a diameter to accommodate an optical path length through the core of approximately one half wavelength of light for the color of interest and may be comprised of 15 or more individual material layers each having a thickness to accommodate an optical path length through the layer of one quarter wavelength of light for the color of interest. For individualized colors from blue to red this layer-on-layer construction surrounding the core sphere may result in an overall particle size of from about 1.9 microns up to 2.6 microns. This range of overall particle sizes for the multi-layered construction of the transparent spheres is comparable to the typical ranges of diameters of paint pigment particles. Apparent colors, patterns or images of light scattering layers may be produced by adjusting refractive indices of the particles according to a size of the spherical core and the layers of material deposited on the spherical core of the particles. Such particle compositions allow for additional degrees of freedom in adjusting the color, transmission and scattering, i.e., in "tuning" the energy/light scattering effects produced by the composition of the energy/light scattering layer. As mentioned above, an outer layer may be formed of a neutral, transparent, often dielectric material of a thickness selected to provide a minimum required separation between the "colorant" layers of the substantially transparent multi-layer micron-sized particles to reduce instances of refractive interference thereby causing variation in the color presentation provided by the light scattering layer.

Dielectric materials from which the core sphere and the dielectric materials may be selected may be chosen generally from a group consisting of titanium dioxide, silicon carbide, boron nitride, boron arsenite, aluminum nitride, aluminum phosphide, gallium nitride, gallium phosphide, cadmium sulfide, zinc oxide, zinc selenide, zinc sulfide, zinc telluride, cuprous chloride, tin dioxide, barium titanate, strontium titanate, lithium niobate, nickel oxide, and other similar materials.

Particle size is related to the wavelength of interest, in the manner described above, in order to determine the color of the substantially transparent multi-layer micron-sized particles. Spacing between the particles is related to the size in order to reduce interference between the refractions of separate particles. In embodiments, the binder index of refraction may be the same as an outer layer of the particles in order that the outer layer does not optically interact with the next layer inward. In such an instance, the outer layer may be thicker and particle-to-particle optical interaction is minimized. Because where there is a difference in index of refraction (according to Snell's Law), a reflection occurs.

When two reflections are spaced properly, the interaction of multiple reflections is what provides the color.

The outer layer may be configured to ensure that the colorant producing layers of the particles are kept separated. In an instance in which the colorant producing layers touch, no interaction reflection is generated. A result of a configuration of a particle according to this scheme is a particle that acts in a form of a Bragg Reflector. Multiple weak reflections of a same wavelength reinforce each other resulting in a strong reflection of a particular wavelength based on the particle size, which determines the particle spacing, and the index of refraction also determines the speed of light which in turn describes the optical wavelength. A number of particles per unit volume of solvent (matrix material) essentially ensures that the particles always touch.

The outer layer will typically be thicker than the underlayers of which the substantially transparent multi-layer micron-sized particle is comprised in order to attempt to ensure that safe separation is maintained. If the outer layer is controlled to be composed of a material that is at a same index of refraction as the binder or matrix material, the outer layer does not optically react in interaction with the binder or matrix material. The outer layer will be transparent, and maintain that transparency when immersed in the substantially-transparent binder or matrix material having a same index of refraction as the outer layer of substantially transparent multi-layer micron-sized particles. In this manner, the outermost layers, in their composition and thickness, provide the essential interstitial spacing between the colorant components so as to assure color fidelity. The layers thus formed will yield only the color that is "built in" to the substantially transparent multi-layer micron-sized particles according to the structure of the color yielding/generating underlayers inward of the outermost layers in the manner described below.

With enough layers, in a range of 10 to 15, to as many as 30, layers, color concentration would be high enough in each of the particles so as to not require external coloration reinforcement provided by adjacent multi-layer particles. The outer layers are comparatively clear, as is the binder or matrix solution, and preferably having a comparatively same index of refraction as between the material forming the outer layers and the material forming the binder solution. This is to ensure that there is no interaction between the particles in the binder, and no interaction between the particles, specifically the color yielding/generating components of the particles over a longer distance. The outer layers may be comparatively, e.g., 10 times the thickness of each of the underlying dielectric layers.

The substantially transparent multi-layer micron-sized particles may be formed in a very tightly-controlled particle build process. A spherical core may be formed in a material or layer deposition process such as, for example, an atomic layer deposition (ALD) process, to achieve the substantially transparent multi-layer micron-sized particles according to the disclosed schemes. Particle deposition control systems exist that can be scaled to produce these substantially transparent multi-layer micron-sized particles. Quality control in the particle build process produces the necessary level of color consistency. There are, however, deposition processes that can be controlled to the units of nanometers thicknesses.

Additionally, embodiments of the multi-layered particles may include metallic layers sandwiched in between pairs of dielectric layers. A thickness of the metallic layers may be between 0.01 nm and 10 nm, as long as the metallic layers remain substantially transparent. The presence of such metallic layers is intended to enhance reflectivity properties with respect to the multi-layered structure of the color yielding/generating layers of the substantially transparent multi-layer micron-sized particles. Indium titanium oxide (ITO) is an example of a metallic layer that is conductive, yet substantially transparent. A typical touch screen on a cellular telephone, for example, includes an ITO surface.

Any suitable acrylic, polyurethane, clearcoat, or like composed binder or matrix material having a low index of refraction may be adapted to suspend the multi-layer micron-sized particles for application to a broad spectrum of substrate materials. These may include, but not be limited to, for example, synthetic or natural resins such as alkyds, acrylics, vinyl-acrylics, vinyl acetate/ethylene (VAE), polyurethanes, polyesters, melamine resins, epoxy, silanes or siloxanes or oils. It is envisioned that, in the same manner that paint pigment particles are suspended in solution, the substantially transparent multi-layer micron-sized particles according to this disclosure may be suspended in solution as well. Unlike paint pigment particles, however, the optical response of particles according to the disclosed schemes will not "fade" over time because there is no pigment breakdown based on exposure to, for example, ultraviolet (UV) radiation. The disclosed particles may also be substantially insensitive to heat.

According to the above, application methodologies that are supportable with particles according to the disclosed schemes include all of those application methodologies that are available for application of paints, inks and other coloration substances to substrates. These include that the particles suspended solutions can be brushed on, rolled on, sprayed on and the like. Separately, the particles may be pre-suspended in the solutions for on-site apparatus mixing into the deliverable solutions at the point of delivery to a substrate surface. The particles may be delivered via conventional aspirated spray systems and/or via aerosol propellants including being premixed with the propellants for conventional "spray can" delivery. Finally, the particles may be dry delivered to a binder-coated substrate. Conventional curing methods may be employed to fix the binder-suspended particles on the various substrates.

In the above-described manner, a finished and stabilized apparent colored, multi-component colored, texturized or otherwise image-developed surface transparent light scattering layer is produced. Mass production of such layers could be according to known delivery, deposition and development methods for depositing the light scattering layer forming components on the base structures as layer receiving substrates, and automatically controlling the exposure, activation and/or stabilization of the surface components to achieve a particular colored, multi-colored, texturized and/or image-wise patterned light scattering layer surface.

Additives may be included in the binder or matrix materials in which the substantially transparent multi-layer micron-sized particles are, or are to be, suspended to enhance one or more of a capacity for adherence of the formed transmissive layer to a particular substrate, including an adhesive or the like, and a capacity for enhanced curing of the layer, including a photo initiator or the like.

FIG. 5 illustrates a schematic diagram of an exemplary communication network 500 within which a plurality of self-powered sensor and communication devices according to this disclosure may operate. One or more self-powered sensor and communication devices 510-518 may be provided in proximity to one another. When provided proximately to one another, the one or more self-powered sensor and communication devices 510-518 may automatically communicatively coupled with one another in pairs or in multiples to create a form of an ad hoc mesh network in order that communications from any one of the one or more self-powered sensor and communication devices 510-518 may be transmitted via other ones of the one or more self-powered sensor and communication devices 510-518 to a local sensor data collection point 520.

Figure 5:
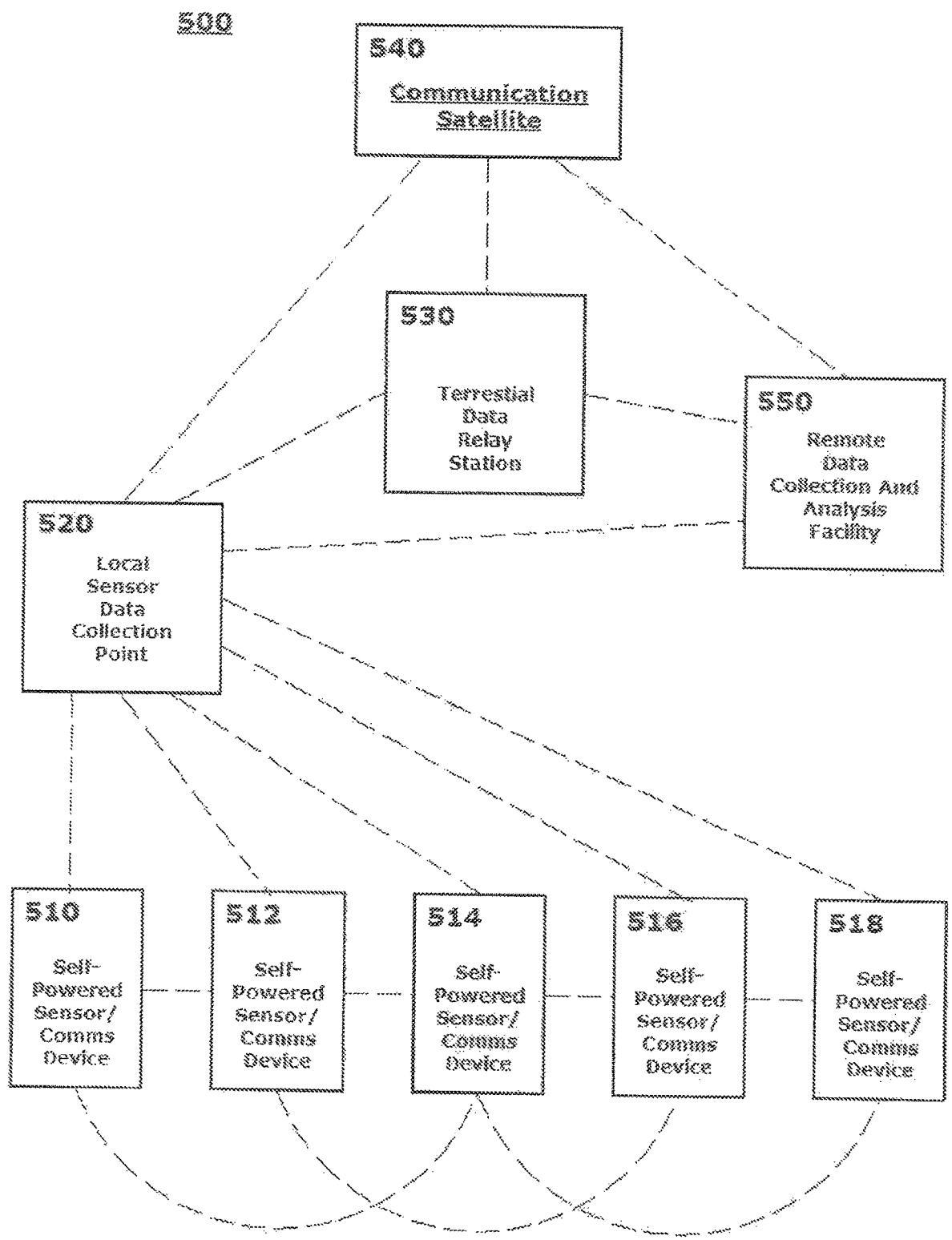
FIG. 5 illustrates a schematic diagram of an exemplary communication network within which a self-powered sensor and communication device according to this disclosure may operate.

A local sensor data collection point 520 may be provided in a form of a local transceiver that may communicate with one or more of the self-powered sensor and communication devices 510-518. The local sensor data collection point 520 may be configured to be limitedly visibly detectable and to belie any conductivity with the one or more self-powered sensor and communication devices 510-518 even if detected. The local sensor data collection point 520 may be configured to communicatively couple with either or both of a terrestrial data relay station 530 and a communication satellite 540 in order to extend a range of data transmission from the one or more self-powered sensor and communication devices 510-518, for example, to a remote data collection and analysis facility 550. The terrestrial data relay station 530 may be in a form of a radio transceiver, but also may be in a form of a Wi-Fi (or other communicating protocol) wireless access point with which the local sensor data collection point 520 may be configured to communicate. In this manner, for example, when the one or more self-powered sensor and communication devices 510-518 is configured as a tracking device on any one of, for example, a commercially shipped package, personal luggage in transit, a government-owned "trackable" asset, or the like, each of the one or more self-powered sensor and communication devices 510-518, connecting independently with one another, may separately connect with any wireless access portal, or may connect with a separate wireless local sensor data collection point 520 that may, in turn, connect with any wireless access portal. The system architecture, generally shown in FIG. 5, is intended to illustrate typical combinations of communications connections that may be exploited by the one or more self-powered sensor and communication devices 510-518 according to this disclosure. In this regard, the depiction of the system architecture is not intended to be limiting in any way.

Figure 6:
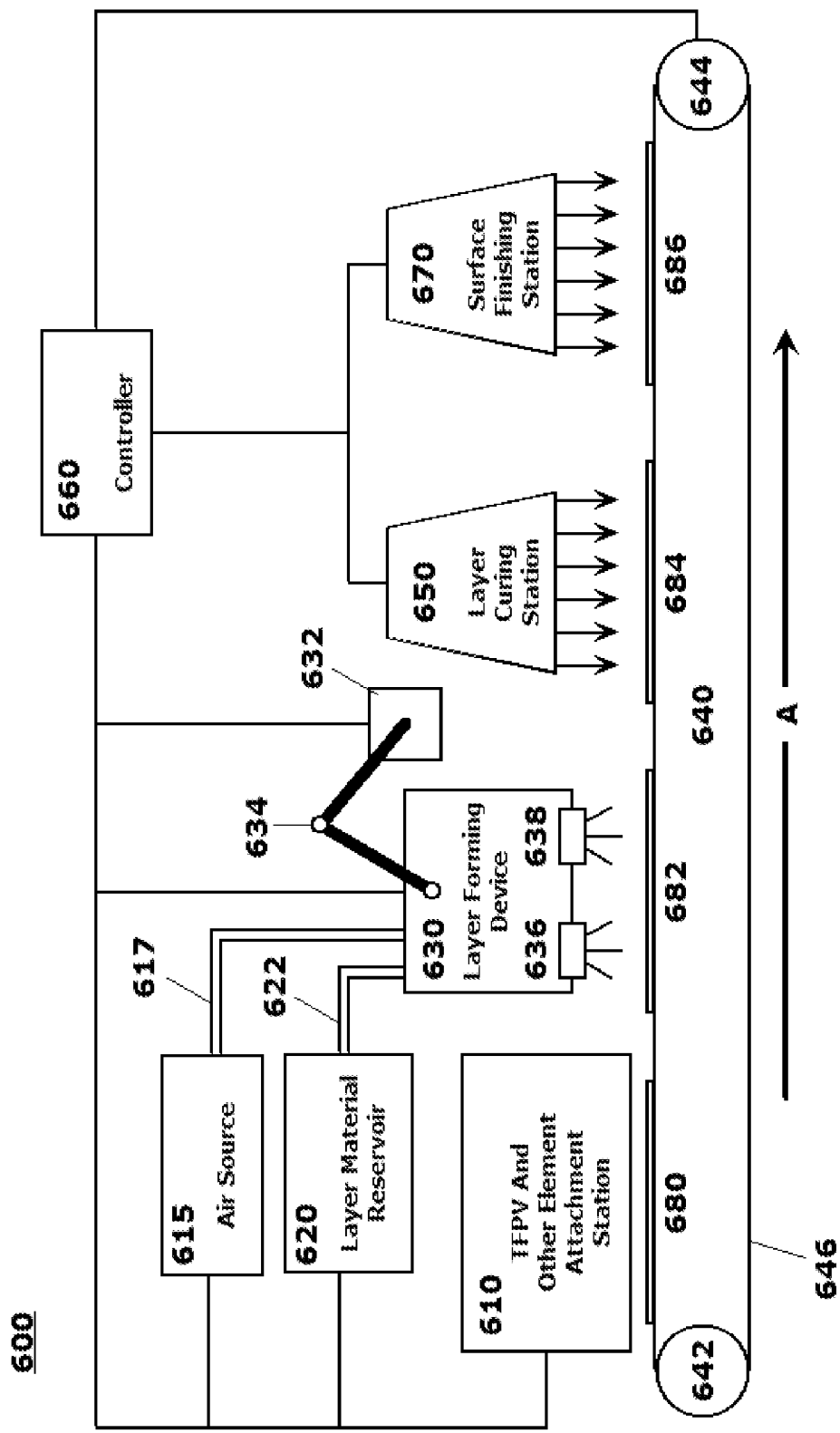
FIG. 6 illustrates a schematic diagram of an exemplary assembly line usable for automated forming of the exemplary laminated energy harvesting, sensor, communication and other components on a substrate to form a self-powered sensor and communication device according to this disclosure.

FIG. 6 illustrates a schematic diagram of an exemplary assembly line usable for automated forming of the exemplary laminated energy harvesting, sensor, communication and other components on a substrate to form a self-powered sensor and communication device according to this disclosure. The exemplary system 600 may be used to prepare and build the laminated energy harvesting component structure in a manner similar to that described above with reference to FIGS. 3A-3D.

As shown in FIG. 6, the exemplary system 600 may include an assembly line type transport component 640 which may be in a form of powered roller elements 642, 644 about which a movable platform in a form of, for example, a conveyor belt 646 may be provided to move a substrate past multiple processing station 680, 682, 684, 686 in a direction A to accomplish the layer forming and finishing elements of the laminated energy harvesting component build process. Operation of the transport component may be controlled by a controller 660.

A photovoltaic array or TFPV and other element attachment station 610 may be generally provided along the assembly line, or separately, as one or more separate processing tasks, to provide for adhesive adherence of, for example, a TFPV material layer and other sensor and communication elements on a surface of the substrate when the substrate is positioned at processing station 680. Operation of the TFPV and other element attachment station 610 may be controlled by the controller 660.

A layer forming device 630 may be provided at, for example, processing station 682 as the substrate is moved in direction A from processing station 680. The layer forming device 630 may comprise a plurality of spray nozzles or spray heads 636, 638, which may be usable to facilitate deposition of a layer forming material over the previously placed TFPV material layer on a surface of the substrate.

The layer forming device 630 may be connected to an air source 615 via piping 617 and may separately be connected to a layer material reservoir 620 via piping 622. The layer forming device 630 may be usable to obtain a flow of layer material from the layer material reservoir 620 and entrain that layer material in an airstream provided by the air source 615 in a manner that causes aspirated layer material to be ejected from the spray nozzles or spray heads 636, 638 in a direction of the substrate when the substrate is positioned at processing station 682.

The layer material reservoir 620 may include separate chambers for a supply of substantially transparent micronsized particles and for a supply of binder or matrix material. In embodiments, the particles and the matrix material may come premixed, the particles and matrix material may be mixed in the layer material reservoir 620, or the particles and matrix material may be separately fed to the layer forming device 630 and mixed therein before being entrained in the airstream provided to the layer forming device 630 by the air source 615. The layer forming device 630 may be a mounting structure or, in embodiments, the layer forming device 630 may be a movable structure mounted to the end of, for example, an articulated arm 634 that is mounted to a base component 632. In embodiments, a particle and matrix material mixture may be provided in a material supply reservoir of a conventional spray gun with an air source for delivery of the layer material in a delivery operation similar to a conventional spray painting of a surface. In embodiments, an entire surface of the substrate may be covered with the light scattering layer material. In this manner, a consistency of coloration in the substrate finish may be obtained as between areas including photovoltaic arrays and areas of the substrate surface that do not include such underlying elements. Operation of the components of the layer forming device 630 (including the articulated arm 634 and the base component 632), the air source 615, and/or the layer material reservoir 620, may be separately controlled by the controller 660.

The substrate may be translated then to a processing position 684 opposite a layer curing station 650 that may employ known layer fixing methods including using heat, pressure, photo-initiated chemical reactions and the like to cure and/or finish the light scattering layers on the substrate surface. The substrate may then be translated to a processing station 686 opposite a surface finishing station 670 which may, for example, to deposit a clearcoat over an entire surface of the substrate, or undertake other finishing processing of the surface of the substrate.

The exemplary system 600 may operate under the control of a processor or controller 660. Layer and object forming information may be input regarding at least one light scattering layer to be formed and fixed on an object or substrate by the exemplary system 600. The controller 660 may be provided with object forming data that is devolved, or parsed, into component data to execute a controllable process in which one or more light scattering layers are formed to produce a single color, a multi-color, texturized surface or an image-patterned presentation when viewed from the viewing, observation or light incident side of a finished light scattering layer on the substrate.

Figure 7:
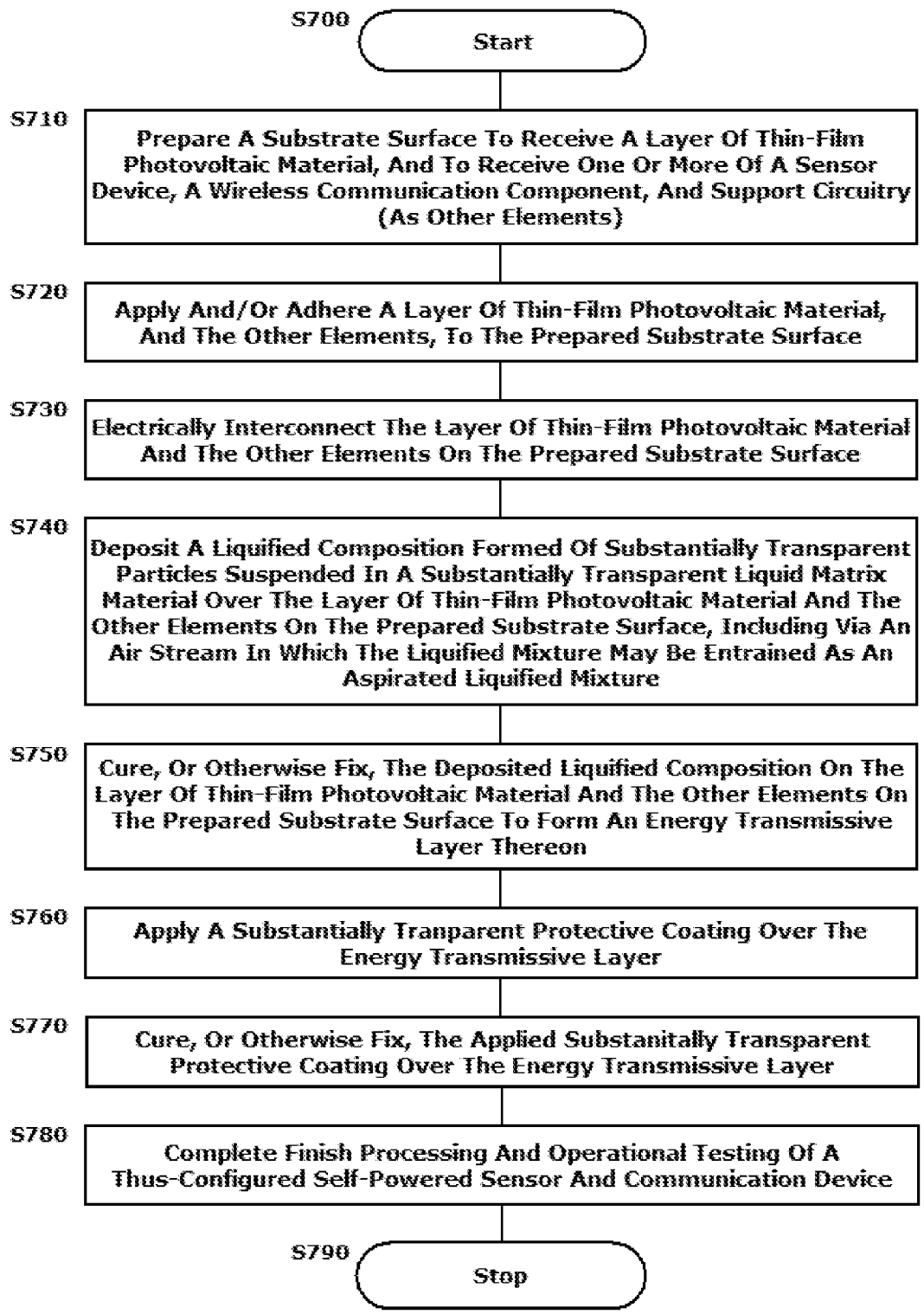
FIG. 7 illustrates a flowchart of an exemplary method for integrating a unique energy harvesting system, including an energy/light scattering layer, sensor, communication and other components on a substrate to form a self-powered sensor and communication device according to this disclosure.

The disclosed embodiments may include an exemplary method for integrating a unique energy harvesting system, including an energy/light scattering layer, sensor, communication and other components on a substrate to form a self-powered sensor and communication device. FIG. 7 illustrates a flowchart of such an exemplary method. As shown in FIG. 7, operation of the method commences at Step S700 and proceeds to Step S710.

In Step S710, one or more discrete substrate surfaces may be prepared to receive a layer of TFPV material, and separately or coincidentally to receive one or more of a sensor device, a wireless communication component, and supporting circuitry by which the individual components may be electrically connected. Operation of the method proceeds to Step S720.

In Step S720, a layer of TFPV material may be applied to the prepared substrate surface according to an application method that may adhere the layer of TFPV material to the substrate. Separately, the other elements may be adhered to the substrate. Compatible adhesive materials, including chemical, heat, or light activated adhesive materials, may be used to provide the adherence of the TFPV material layer and the other elements to the substrate. It should be noted that portions of the particular substrate, or other portions of the substrate, not covered by the TFPV material or other elements may be separately or coincidentally prepared with finishes that are comparable to the finish displayed by the TFPV material layer in order that the substrate may provide a consistent underlying appearance, particularly with regard to an optical reflectance, for application of the energy transmissive layer materials thereon. Operation of the method proceeds to Step S730.

In Step S730, the TFPV material layer and the other elements disposed on, or adhered to, the substrate may be electrically interconnected. Operation of the method proceeds to Step S740.

In Step S740, a liquefied mixture of components for forming an energy transmissive layer composed of substantially transparent particles suspended in a substantially transparent liquefied matrix may be deposited over the layer of TFPV material, or over an entire structure of the substrate. Such deposition may be according to any technique by which a liquefied matrix, which may appear in the form of the paint-like substance, may be applied to any substrate. In this regard, the liquefied mixture may be poured on, rolled on, brushed on, or sprayed on the substrate surface. In this latter case, an airstream may be provided from an air source in which the liquefied mixture may be entrained as one of an aspirated and aerosol liquefied mixture. Operation of the method proceeds to Step S750.

As indicated above, in embodiments, the liquefied mixture may include formed multi-layered substantially transparent particles suspended in a substantially transparent liquefied matrix material to form the liquefied mixture. The substantially transparent liquefied matrix material may be selected to have an index of refraction similar to the substantially clear outer layers or shells of the substantially transparent particles in order to substantially reduce any potential for refractive interference between adjacent particles when deposited on the substrate surface. The substantially transparent liquefied matrix material may include components to aid in adherence of the finished energy transmissive layers on the portions of the substrate surface on which those layers are ultimately formed. The substantially transparent liquefied matrix material may include components to aid in fixing of the substantially transparent particles in the layer, including heat-activated and/or light-activated hardeners. The sizing of the particles to be less than 5 microns expands the latitude by which the substantially transparent particles suspended in the matrix material may be delivered to the substrate surface by rendering those particles compatible with the spray techniques discussed above. As such, in a delivery process that mirrors conventional spray painting, the aspirated liquefied mixture may be deposited on the prepared surface to form the energy transmissive layer that passes certain wavelengths of energy/light through the layer based and scatters other selectable wavelengths of energy/light to render a perceptibly single color, multi-color, patterned, texturized or image-wise presentation of scattered light from the light incident surface based on one or more delivery passes for depositing the energy transmissive layer materials according to the above-described schemes.

In Step S750, the deposited liquefied mixture may be developed, cured, or otherwise fixed over the TFPV material layer, the other elements and on any other portions of the substrate onto which the liquefied mixture is deposited for coloration of those portions of the substrate to form a fixed energy transmissive layer thereon. Operation of the method proceeds to Step S760.

In Step S760, a protective coating may be applied over the energy transmissive layer. The protective coating may take a form of, for example, a commercial clearcoat finishing composition. Operation of the method proceeds to Step S770.

In Step S770, the applied protective coating may be cured or otherwise fixed over the energy transmissive layer formed on the surface of the substrate. Operation of the method proceeds to Step S780.

In Step S780, finished processing and operational testing of a thus-configured self-powered sensor and communication device may be completed according to known methods. Operation of the method proceeds to Step S790, where operation of the method ceases.

The above-described exemplary particle and material formulations, layered component build processes, and systems and methods for applying laminated energy harvesting and other components to portions of a substrate reference certain conventional components, energy harvesting elements, sensor elements, communication components, materials, and real-world use cases to provide a brief, general description of suitable operating, product processing, energy/light scattering (transmissive) layer forming and substrate modification and integration environments in which the subject matter of this disclosure may be implemented for familiarity and ease of understanding. Although not required, embodiments of the disclosure may be provided, at least in part, in a form of hardware control circuits, firmware, or software computer-executable instructions to control or carry out the laminated structure development functions described above. These may include individual program modules executed by processors.

Those skilled in the optics, electrical generation and sensor and communication arts will appreciate that other embodiments of the disclosed subject matter may be practiced in many disparate film forming, layer forming, laminate layer forming and component production systems, techniques, processes and/or devices, including various machining, molding, additive and subtractive layer forming and manufacturing methods, of many different configurations.

Embodiments within the scope of this disclosure may include processor components that may implement certain of the steps described above via computer-readable media having stored computer-executable instructions or data structures recorded thereon that can be accessed, read and executed by one or more processors for controlling the disclosed energy/light scattering layer forming and integration schemes. Such computer-readable media can be any available media that can be accessed by a processor, general purpose or special purpose computer. By way of example, and not limitation, such computer-readable media can comprise RAM, ROM, EEPROM, CD-ROM, flash drives, data memory cards or other analog or digital data storage device that can be used to carry or store desired program elements or steps in the form of accessible computer-executable instructions or data structures for carrying into effect, for example, computer-aided design (CAD) or computer-aided manufacturing (CAM) of particular objects, object structures, layers, and/or layer components.

Computer-executable instructions include, for example, non-transitory instructions and data that can be executed and accessed respectively to cause a processor to perform certain of the above-specified functions, individually or in various combinations. Computer-executable instructions may also include program modules that are remotely stored for access and execution by a processor.

The exemplary depicted sequence of method steps represent one example of a corresponding sequence of acts for implementing the functions described in the steps of the above-outlined exemplary method. The exemplary depicted steps may be executed in any reasonable order to carry into effect the objectives of the disclosed embodiments. No particular order to the disclosed steps of the methods is necessarily implied by the depiction in FIG. 7, except where a particular method step is a necessary precondition to execution of any other method step.

Although the above description may contain specific details, they should not be construed as limiting the claims in any way. Other configurations of the described embodiments of the disclosed systems and methods are part of the scope of this disclosure.

It will be appreciated that various of the above-disclosed and other features and functions, or alternatives thereof, may be desirably combined into many other different systems or applications. Also, various alternatives, modifications, variations or improvements therein may be subsequently made by those skilled in the art which are also intended to be encompassed by the following claims.

The invention claimed is:

1. A method for integrating an energy harvesting system in a self-powered sensor device, comprising:
providing an energy harvesting element;
providing a sensor device, the sensor device being powered by electrical energy generated by the energy harvesting element and configured to generate an output signal according to a sensed parameter measured by the sensor device;
electrically connecting the sensor device and the energy harvesting element such that the sensor device and the energy harvesting element are in electrical communication; and
arranging an energy transmissive layer over the energy harvesting element, the energy transmissive layer having an energy-incident side,
the energy-incident side presenting a consistent opaque appearance when viewed from substantially any aspect, and
the energy transmissive layer passing 50% or more of light energy impinging on the energy transmissive layer through the energy transmissive layer to activate the energy harvesting element.

2. The method of claim 1, further comprising:
providing an electrical energy storage device; and
electrically connecting the electrical energy storage device to the energy harvesting element,
the electrical energy storage device being configured to store electrical energy generated by the energy harvesting element.

3. The method of claim 1, further comprising:
providing a first wireless communicating device;
electrically connecting the first wireless communicating device to the energy harvesting element;
communicatively connecting the first wireless communicating device to the sensor device,
the first wireless communicating device being configured to establish communication with at least one of (1) a second wireless communicating device of at least one second self-powered sensor device, and (2) a receiver unit of the second self-powered sensor device located remotely from the self-powered sensor device,
the first wireless communicating device being configured to transmit first data communications based on the output signal of the sensor device.

4. The method of claim 3, further comprising:
providing a geolocation device, the geolocation device being configured to determine a location of the self-powered sensor device and to generate a location output signal;
electrically connecting the geolocation device to the energy harvesting element; and
communicatively connecting the geolocation device to the first wireless communicating device,
the first wireless communicating device being configured to transmit second data communications based on the location output signal.

5. The method of claim 3, further comprising:
providing a processor;
electrically connecting the processor to the energy harvesting element; and
communicatively connecting the processor to the sensor device and the first wireless communicating device,
the processor being programmed to
control operation of the sensor device and the first wireless communicating device; and
convert the output signal of the sensor device to the first data communications for transmission by the first wireless communicating device.

6. The method of claim 1, further comprising forming the energy transmissive layer of a material composition comprising a plurality of substantially-transparent particles and a substantially-transparent matrix material that fixes the plurality of substantially-transparent particles in a layer arrangement to form the energy transmissive layer.

7. The method of claim 6, further comprising fixing the plurality of substantially-transparent particles in the matrix material in a manner that causes the energy-incident side to reflect substantially all of one or more selectable wavelengths of the impinging light energy in all directions on the energy-incident side to present the consistent opaque appearance.

8. The method of claim 6, further comprising forming each of the plurality of substantially-transparent particles of:
a spherical core formed of a first transparent dielectric material, the spherical core having a value of a physical diameter equal to a half wavelength of a first selected color of light component to be reflected by the substantially-transparent particle modified by a first refractive index of the first transparent dielectric material;

a plurality of material layers disposed radially outwardly from the spherical core, each of the plurality of material layers being formed of at least a second transparent dielectric material, and having a value of a physical thickness equal to a quarter wavelength of at least a second selected color of light component to be reflected by the substantially-transparent particle modified by a second refractive index of the at least the second transparent dielectric material; and an outer coating comprised of another transparent dielectric material having a selected index of refraction of 2 or less, the outer coating having a thickness that substantially eliminates reflective interference between colors reflected by adjacent particles when in contact with one another.

9. The method of claim 8, further comprising adjusting an index of refraction of the substantially transparent liquid matrix material to be a same index of refraction as the outer coating.

10. The method of claim 6, the energy harvesting element comprising a photovoltaic element.

11. The method of claim 10, the photovoltaic element being a photovoltaic film (PVF) material.

12. The method of claim 11, further comprising applying the PVF material to one or more discrete portions of the surface of the body structure.

13. The method of claim 6, the arranging the energy transmissive layer over the energy harvesting element comprising:
   delivering the material composition in a liquid form; and
   applying one of heat or light energy to fix the material composition to form the energy transmissive layer.

14. The method of claim 13, each of the substantially-transparent particles having a diameter in a range of 5 microns or less.

15. The method of claim 14, each of the substantially-transparent particles having a diameter in a range of 1.0 to 3.0 microns.

16. The method of claim 13, further comprising separately entraining the plurality of substantially-transparent particles and the substantially-transparent matrix material in the air stream to form the material composition sprayed on the surface of the energy harvesting element.

17. The method of claim 1, further comprising arranging a substantially transparent protective coating over the energy transmissive layer.

18. The method of claim 1, the energy transmissive layer being arranged to pass 80% or more of light energy impinging on the energy transmissive layer through the energy transmissive layer to activate the energy harvesting element.

* * * * *